US009959166B2

(12) United States Patent
Mateescu et al.

(10) Patent No.: US 9,959,166 B2
(45) Date of Patent: *May 1, 2018

(54) ERROR CORRECTION FOR NON-VOLATILE MEMORY

(71) Applicant: Western Digital Technologies, Inc., Irvine, CA (US)

(72) Inventors: Robert Mateescu, San Jose, CA (US); Zvonimir Z. Bandic, San Jose, CA (US); Yongjune Kim, Pittsburgh, PA (US); Seung-Hwan Song, San Jose, CA (US)

(73) Assignee: WESTERN DIGITAL TECHNOLOGIES, INC., Irvine, CA (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/463,395

(22) Filed: Mar. 20, 2017

(65) Prior Publication Data
US 2017/0192846 A1  Jul. 6, 2017

Related U.S. Application Data

(63) Continuation of application No. 14/627,570, filed on Feb. 20, 2015, now Pat. No. 9,619,320.

(51) Int. Cl.
*G06F 11/10* (2006.01)
*G11C 29/52* (2006.01)
(Continued)

(52) U.S. Cl.
CPC ......... *G06F 11/1068* (2013.01); *G11C 29/08* (2013.01); *G11C 29/52* (2013.01);
(Continued)

(58) Field of Classification Search
CPC ...................................................... G06F 11/10
(Continued)

(56) References Cited

U.S. PATENT DOCUMENTS 6,035,432 A    3/2000  Jeddeloh
8,745,453 B1   6/2014  Sutardja et al.
(Continued)

OTHER PUBLICATIONS

Altera, "Error Correction Code in SoC FPGA-Based Memory Systems," Altera Corporation, 10 pages (Apr. 2012).
(Continued)

*Primary Examiner* — Fritz Alphonse
(74) *Attorney, Agent, or Firm* — Patterson + Sheridan, LLP

(57) ABSTRACT

Techniques for encoding data for non-volatile memory storage systems are disclosed. In one particular embodiment, the techniques may be realized as a method including determining whether the memory includes a defective memory cell, receiving a message to be written to the memory, subdividing the message into a plurality of sub-messages, generating a first error correction code for the sub-messages, the first error correction code being a first type, generating a plurality of second error correction codes for the sub-messages, the second error correction codes being a second type different from the first type, generating a combined message comprising the sub-messages, the first error correction code, and the plurality of second error correction codes, and writing the combined message to the memory, at least a portion of the combined message being written to the defective memory cell.

20 Claims, 8 Drawing Sheets

(51) Int. Cl.
 H03M 13/29 (2006.01)
 H03M 13/00 (2006.01)
 G11C 29/08 (2006.01)
 G11C 29/00 (2006.01)
(52) U.S. Cl.
 CPC ....... *G11C 29/765* (2013.01); *H03M 13/2903* (2013.01); *H03M 13/6502* (2013.01)
(58) Field of Classification Search
 USPC .............................. 714/764, 766, 768, 770
 See application file for complete search history.

(56) References Cited

U.S. PATENT DOCUMENTS

| | | | |
|---|---|---|---|
| 8,910,021 B2 | 12/2014 | Shalvi et al. | |
| 2007/0033449 A1 | 2/2007 | Hwang et al. | |
| 2007/0277066 A1 | 11/2007 | Gajapathy et al. | |
| 2012/0188830 A1 | 7/2012 | Jeong | |
| 2014/0068379 A1* | 3/2014 | Sakaue | G06F 11/10 714/764 |
| 2015/0199234 A1* | 7/2015 | Choi | G11C 29/42 714/764 |
| 2015/0227419 A1* | 8/2015 | Sakaue | G11C 29/52 714/764 |
| 2015/0248322 A1* | 9/2015 | Hara | G06F 11/073 714/53 |

OTHER PUBLICATIONS

Azevedo et al., "Zombie Memory: Extending Memory Lifetime by Reviving Dead Blocks," Microsoft Research, University of Campinas, 12 pages (2013).

Dgien, "Compression Architecture for Bit-Write Reduction in Non-Volatile Memory Technologies," University of Pittsburgh, 61 pages (2014).

Kuznetsov et al., "An error correcting scheme for defective memory," IEEE Transactions on Information Theory (Impact Factor), vol. 24, No. 6, Abstract only, 2 pages (1978).

Olson and Langlois, "Solid State Drives: Data Reliability and Lifetime," White Paper, Imation, 27 pages (2008).

* cited by examiner

ERROR CORRECTION FOR NON-VOLATILE MEMORY

CROSS-REFERENCE TO RELATED APPLICATIONS

This application is a continuation of co-pending U.S. patent application Ser. No. 14/627,570, filed Feb. 20, 2015, which is herein incorporated by reference.

BACKGROUND

Non-volatile memory storage systems are a type of memory commonly used in computer systems. Non-volatile memory such as solid state drives and hard drives provide particular benefits including, for example, the ability to store data with high data access and throughput rates. However, non-volatile memory (NVM) may develop or include defective memory cells unable to store information properly leading to errors. Non-volatile memory (NVM) may also generate errors due to noise or interference between cells. Traditional methods of correcting for these errors, however, utilize complex encoding schemes and may negatively impact the lifespan and performance of the memory.

SUMMARY OF THE DISCLOSURE

Techniques for a method of error correcting data for writing to a memory are disclosed. In one aspect, the present disclosure relates to a method of error correcting data for writing to a memory that includes determining whether the memory includes a defective memory cell, receiving a message to be written to the memory, sub-dividing the message into a plurality of sub-messages, generating a first error correction code for the sub-messages, the first error correction code being a first type, generating a plurality of second error correction codes for the sub-messages, the second error correction codes being a second type different from the first type, generating a combined message comprising the sub-messages, the first error correction code, and the plurality of second error correction codes, and writing the combined message to the memory, at least a portion of the combined message being written to the defective memory cell.

In some embodiments of the present disclosure, the memory is a non-volatile memory storage system, memory module, or CPU cache memory.

In accordance with further aspects of this embodiment, the non-volatile memory storage system is a solid state drive.

In accordance with additional aspects of this embodiment, an output of the defective memory cell is the same for different inputs to the defective memory cell.

In accordance with further aspects of this embodiment, each of the sub-divided messages is of an equal amount of data.

In accordance with additional aspects of this embodiment, the sub-dividing of the message is based on the plurality of second error correction codes.

In accordance with additional aspects of this embodiment, the first error correction code is an error correction code for random errors.

In accordance with additional aspects of this embodiment, the random errors are due to noise in the memory.

In accordance with additional aspects of this embodiment, each of the plurality of second error correction codes corresponds to a single sub-message.

In accordance with additional aspects of this embodiment, one of the plurality of second error correction codes is an error correction code for masking the defective memory cell.

In accordance with further aspects of this embodiment, each of the plurality of second error correction codes are a single bit.

In accordance with other aspects of this embodiment, a value of one of the plurality of second error correction codes is based on a value of the defective memory cell.

In accordance with additional aspects of this embodiment, the method may also include determining whether the value of the defective memory cell matches a value of the sub-message.

In accordance with additional aspects of this embodiment, the method may also include determining whether the value of the of the defective memory cell matches an opposite of the value of the sub-message.

In accordance with additional aspects of this embodiment, the value of the one of the plurality of second error correction codes is set to one or zero based on the determination of whether the value of the defective memory cell matches the value of the sub-message, and whether the value of the of the defective memory cell matches the opposite of the value of the sub-message.

In accordance with other aspects of this embodiment, determining whether the memory includes the defective memory cell comprises reading previously written data from the memory.

In accordance with additional aspects of this embodiment, the determining further comprises comparing the read data to a predetermined data pattern.

In accordance with additional aspects of this embodiment, the method may further include generating a second combined message for a second message to be written to the memory based on the determination of whether the memory includes the defective memory cell; and writing the second combined message to the memory.

Another aspect of the present disclosure relates to a computer program product comprised of a series of instructions executable on a computer, the computer program product performing a process for encoding data for writing to a memory; the computer program implementing the steps of: determining whether the memory includes a defective memory cell, receiving a message to be written to the memory, sub-dividing the message into a plurality of sub-messages, generating a first error correction code for the sub-messages, the first error correction code being a first type, generating a plurality of second error correction codes for the sub-messages, the second error correction codes being a second type different from the first type, generating a combined message comprising the sub-messages, the first error correction code, and the plurality of second error correction codes, and writing the combined message to the memory, at least a portion of the combined message being written to the defective memory cell.

In some embodiments, the techniques may be realized as a system for encoding data for writing to a memory, the system comprising: a determining module that determines whether the memory includes a defective memory cell, a receiving module that receives a message to be written to the memory, a sub-dividing module that sub-divides the message into a plurality of sub-messages, a first error correction code generating module that generates a first error correction code for the sub-messages, the first error correction code being a first type, a second error correction code generating module that generates a plurality of second error correction codes for the sub-messages, the second error correction codes being a second type different from the first type, a combined message generating module that generates a combined message comprising the sub-messages, the first error correction code, and the plurality of second error correction codes, and a writing module that writes the combined message to the memory, at least a portion of the combined message being written to the defective memory cell.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DESCRIPTION

The present disclosure generally relates to encoding data to be written to a non-volatile memory. In one aspect of the present disclosure, the encoding of data may compensate for defective memory cells and errors due to noise in memory by encoding data to mask for defects and separately mask for random errors.

Figure 1:
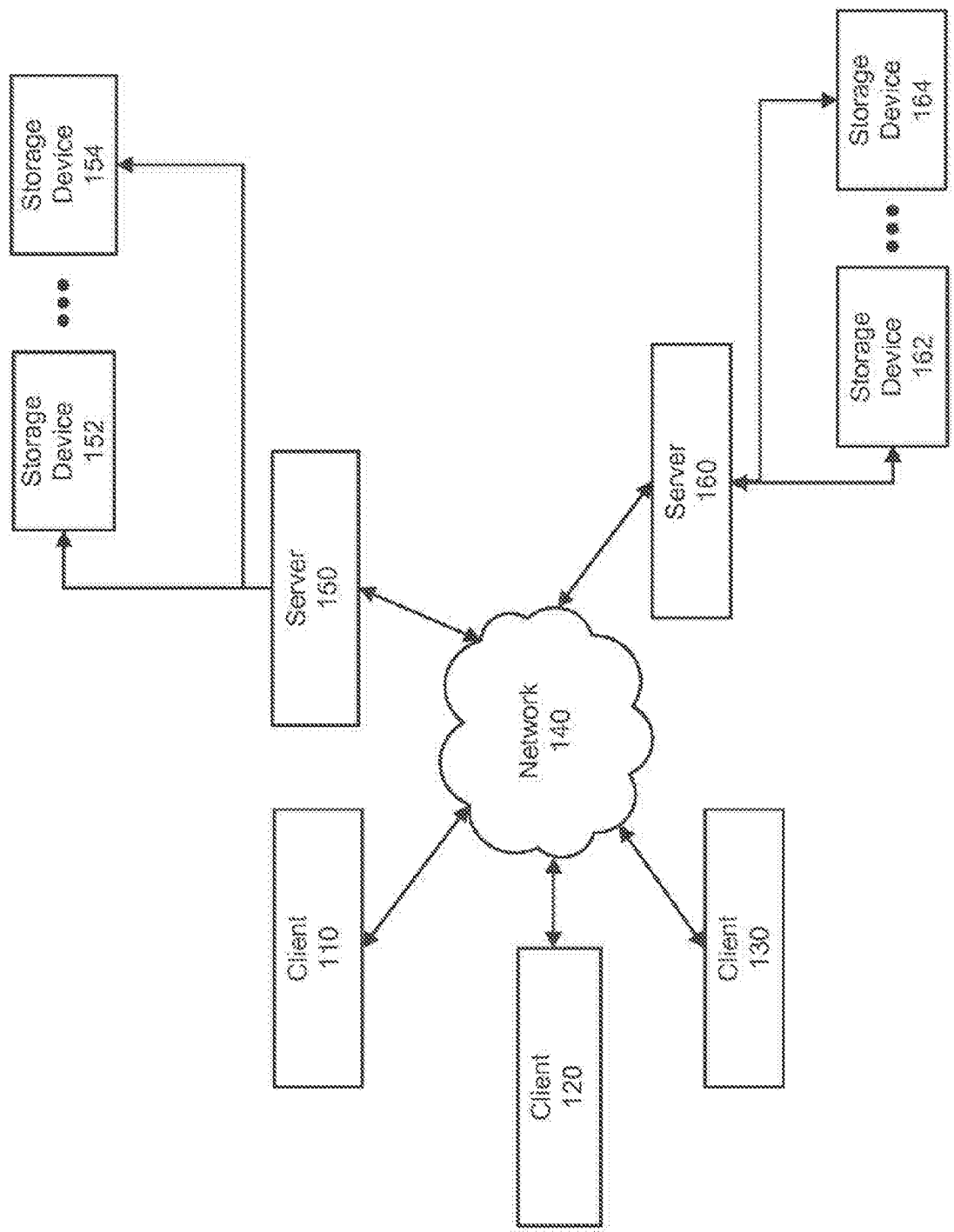
FIG. 1 shows a block diagram depicting a computing architecture in accordance with an embodiment of the present disclosure.

FIG. 1 shows a block diagram depicting a computing architecture 100 in accordance with an embodiment of the present disclosure. The computing architecture 100 may include additional elements that are not depicted. Computing architecture 100 may contain client computing systems 110, 120 and 130, as well as servers 150 and 160. The client computing systems 110, 120 and 130, as well as the servers 150 and 160 may implement the computing system 200 shown in FIG. 2. Each of the clients 110-130 and the servers 150-160 may be communicatively coupled to a network 140. Server 150 may be connected to a plurality of storage devices 152 thru 154. Clients 110-130 may also be connected to a plurality of storage devices (not shown). Server 160 may be connected to a plurality of storage devices 162 thru 164. Although only two storage devices are illustrated as being coupled to the servers 150 and 160, additional storage devices may be provided. In some instances, the storage devices 152, 154, 162, and 164 may be non-volatile memory storage systems. For example, the storage devices 152, 154, 162, and 164 may be solid-state memory, optical memory, magnetic memory, etc.

Figure 2:
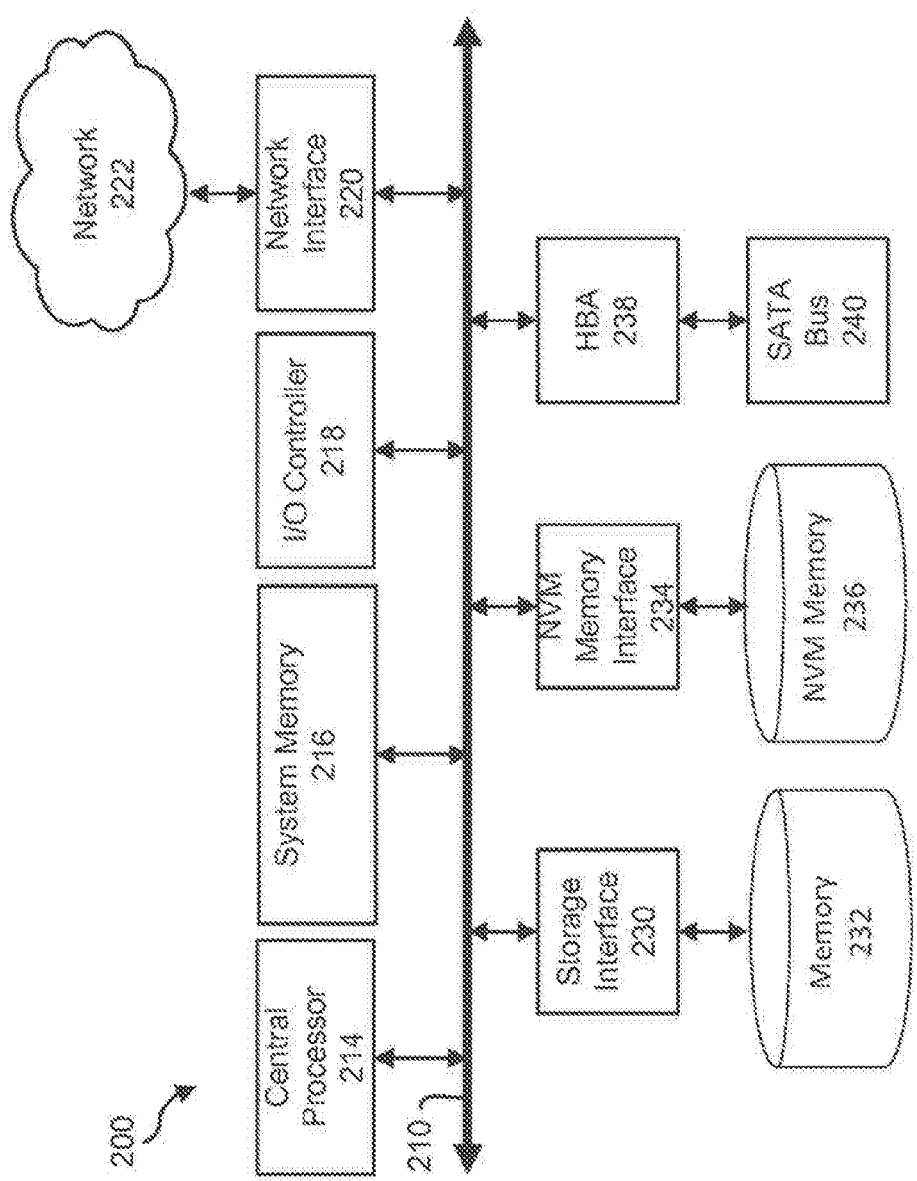
FIG. 2 shows a block diagram depicting a computer system in accordance with an embodiment of the present disclosure.

FIG. 2 shows a block diagram depicting a computer system 200 in accordance with an embodiment of the present disclosure. The computer system 200 may contain a bus 210 connecting subsystems of computer system 200 including a central processor 214, a system memory 216 (e.g., RAM (Random Access Memory), ROM (Read Only Memory), flash RAM, etc.), an Input/Output (I/O) controller 218, and a network interface 220. The network interface 200 may communicatively couple the computer system 200 to a network 222 (e.g., a local area network, wide area network, the internet, etc.). The bus 210 may also connect a storage interface 230 to memory 232, a non-volatile memory interface 234 to non-volatile memory 236, and a host bus adapter (HBA) to a serial ATA (SATA) bus 240. The SATA bus 240 may connect the computer system 200 to additional storage systems. The computer system 200 may contain additional devices or subsystems not illustrated.

Figure 3:
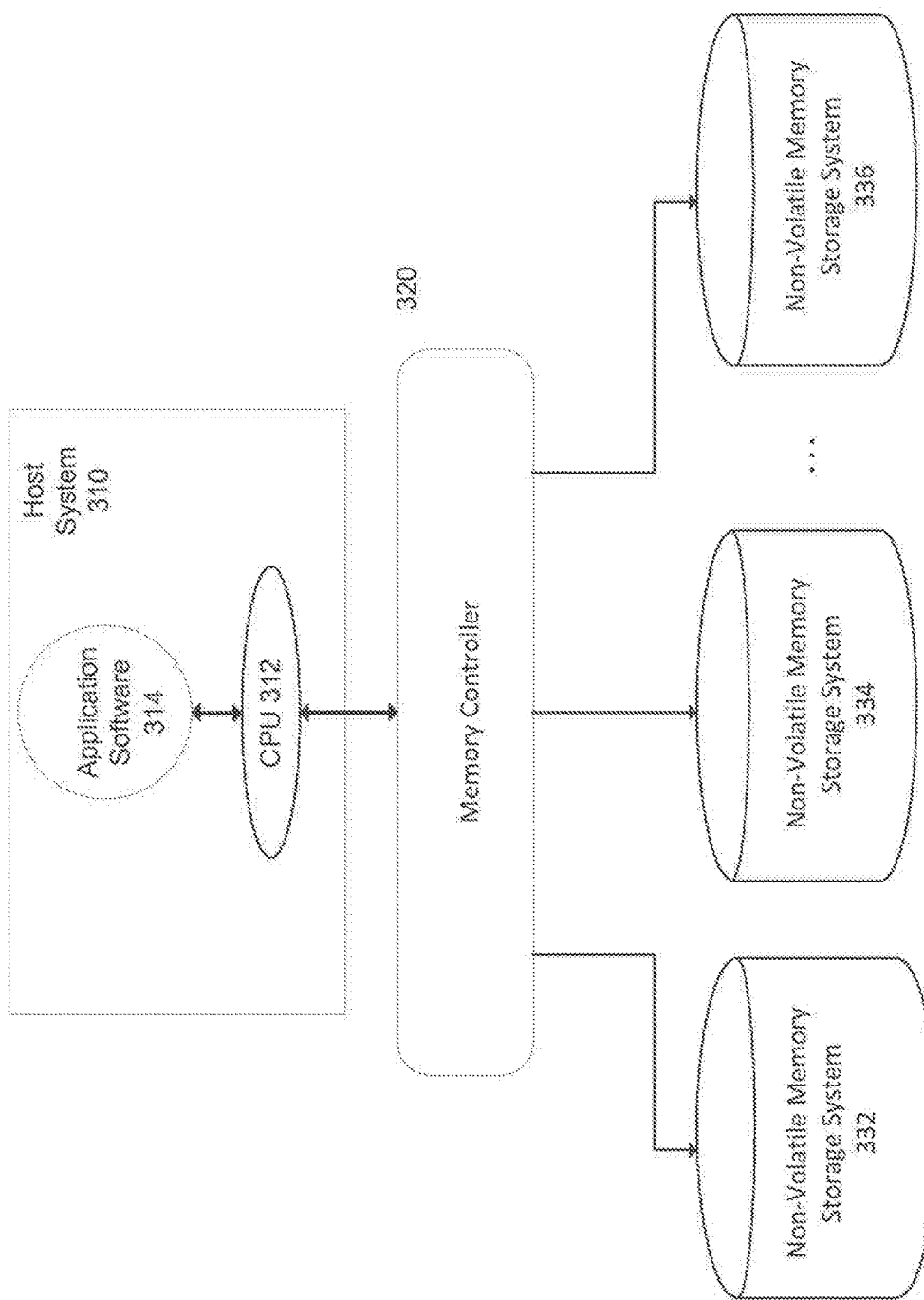
FIG. 3 shows a block diagram depicting a non-volatile storage system in accordance with an embodiment of the present disclosure.

FIG. 3 shows a block diagram depicting a non-volatile memory storage system 300 in accordance with an embodiment of the present disclosure. The non-volatile memory storage system 300 may include a host system 310, a memory controller 320, and non-volatile memory storage systems 332-336. The non-volatile memory storage system 300 may be implemented on any one of the clients 110-130 and the servers 150 and 160. For example, any one of the clients 110-130 and the servers 150 and 160 may be the host system 320 having at least one CPU 312 implementing application software 314. In some instances, the host system 310 may execute application software 314 on at least one CPU 312 to execute operations on the non-volatile memory storage systems 332-336 via the memory controller 320.

The application software 310 may be any applicable software for executing operations (read, write, erase, control operations, etc.) on the non-volatile memory storage system 300. For example, the application software 310 may read or write data stored on any one of the non-volatile memory (NVM) storage systems 332-336. The application software 310 may implement the operations on the NVM storage systems 332-336 via the memory controller 320.

The memory controller 320 shown in FIG. 3 may be a memory controller for implementing operations on the attached NVM storage systems 332-336. In particular, the memory controller 320 may provide processors (e.g., CPU 312) implementing the application software 314 access to the NVM storage systems 332-336. In some instances, the memory controller 320 may be implemented on each of the NVM storage systems 332-336 or as part of a separate computer system (e.g., server 150). In other instances, a single memory controller may be provided to control the NVM storage systems 332-336. The controller 320 may provide buffers or queues to temporarily store operations to be implemented on the NVM storage systems 332-336. The controller 320 may also encode data to be written to the NVM storage systems 332-336.

Figure 4:
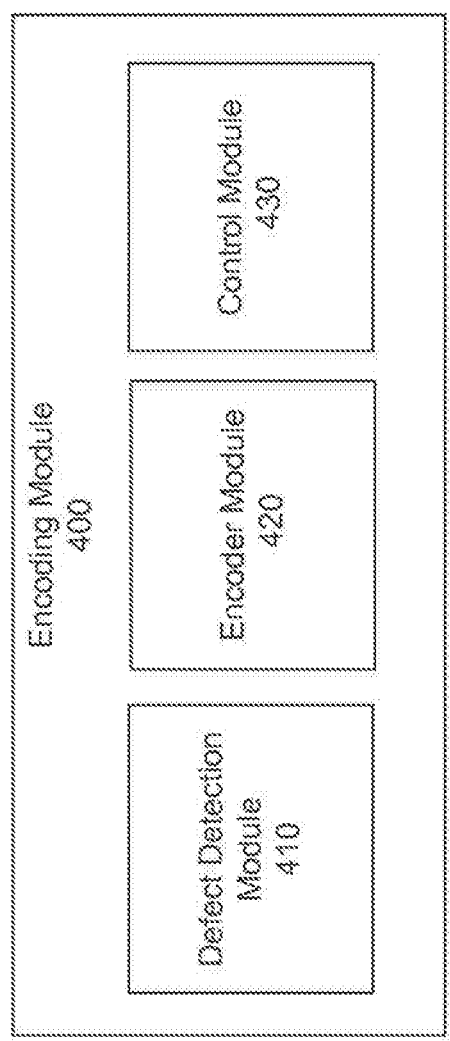
FIG. 4 depicts a block diagram depicting an encoding module in accordance with an embodiment of the present disclosure.

FIG. 4 shows an encoding module 400 in accordance with an embodiment of the present disclosure. As illustrated, the encoding module 400 may contain one or more components including a defect detection module 410, an encoder module 420, and a control module 430.

The defect detection module 410 may detect defects within a NVM storage system. For example, the defect detection module 410 may detect defects within a NVM storage system such as NVM storage systems 332-336. In some embodiments, the defect detection module 410 may detect defects in a NVM storage system by reading data from the NVM storage system. This defect information can then be provided to the encoder module 420 to compensate for any defects or errors when writing new data to the NVM storage system.

In some embodiments, the detection module 410 may determine defects in the NVM storage system due to defective memory cells. In some instances, the defects may be due to a memory cell no longer being capable of properly holding a charge such that after programming, the memory cell's logical value state does not change. This memory cell may return the same value regardless of the value programmed. For example, the memory cell may be "stuck-at" a state corresponding to "0" such that if a value of "0" or "1" is input, the memory cell outputs a "0." To identify these defects, the detection module 410 may cause data to be written to and read from the memory. For example, a predetermined message or data set may be written to the memory and read back from memory. The data read from memory may then be compared to the predetermined message or data set to determine whether the data contains errors due to defective memory cells. The detection module 410 may also determine a positional location within the memory of a defective memory cell. The read back data may be also subjected to other error correcting mechanisms to ensure that the errors are not random but rather defective memory cells. This is just one example of how to determine defective memory cells and other methods may be implemented where appropriate. Upon the detection of any defects in memory, the detection module 410 may provide information regarding the defective cells to the encoder module 420.

The encoder module 420 may encode data to be written to a NVM storage system based on a predetermined algorithm. In some instances, the encoder module 420 may receive defect information from the defect detection module 410 and incorporate this information when encoding the data to be written to the NVM storage system. For instance, the encoder module 420 may encode and map the cell locations of the data to be written to the NVM to take into account the defective memory cells. For example, the encoder module 420 may encode the data to be written such that a value of the data to be written corresponds to the "stuck-at" position of the defective memory cells.

In some embodiments, the encoder module 420 may divide a new message or data set to be written to memory into sub-messages. For example, message "m" comprised of k-bits may be subdivided into sub-messages $m_1, \ldots, m_j$, where l corresponds to bits for redundancy for masking defects. In this example, each sub-message (e.g., $m_i$) corresponds in size to k/l. The encoder module 420 may also generate and associate an error correction code, redundancy $d_i$, for each sub-message $m_i$ to masks defects within that sub-message. In some instances, the redundancy $d_i$ may be a single bit. An example of this is described below with respect to FIG. 7.

The encoder module 420 may also flip the bits associated with any one sub-message based on the defective memory cells to store the sub-message. In particular, the encoder module 420 may compare the values of the sub-message $m_i$ with the values of the stuck-at cells and determine whether more than half of the stuck-at cells correspond to the bit values of the sub-message $m_i$. If more than half of the stuck-at cells correspond to the sub-message $m_i$ data, the encoder module 420 may set $d_i$ to be 0 such that the bits are not flipped. However, if less than half of the stuck-at cells do not correspond to the sub-message $m_i$ data, the encoder module 420 may set $d_i$ to be 1 such that the bits are flipped. As a result, more than half of the sub-message $m_i$ may correspond to the values returned by the defective cells. In one example, sub-message $m_1$ may include 100 bits and ten one-bit memory cells that will store the sub-message $m_1$ are known to be defective. Based on the information from the detection module 410, it is known whether the defective cells are stuck at a "0" or a "1." In this instance, seven of the defective cells match the sub-message $m_1$ while three do not. Accordingly, $d_1$ may be set to 0 such that the values of sub-message $m_1$ are not flipped.

Further, the encoder module 420 may generate a redundancy for correcting random errors p associated with the sub-messages $m_1, \ldots, m_j$. The redundancy for correcting random errors p may be comprised of r-bits. This redundancy p may be for correcting errors due to noise or interference within the memory. After sub-dividing the message $m_i$ generating the redundancy d, and generating the redundancy p, the encoder module 420 may assemble the message to be written to the memory. An example of the assembled message is described below with respect to FIG. 8. After assembling the message to be written, the encoder module 420 may provide this data to the control module 430.

The control module 430 may cause data to be written onto and read from a NVM storage system. In some embodiments, the control module 430 may receive encoded data, an assembled message, from the encoder module 420 and cause that data to be written onto a NVM storage system (e.g., NVM storage systems 332-336). The control module 430 may also cause data to be read from a NVM storage system (e.g., NVM storage systems 332-336). For example, the control module 430 may read data from the NVM and provide that read data to the defect detection module 410 for detection of defects.

Figure 5:
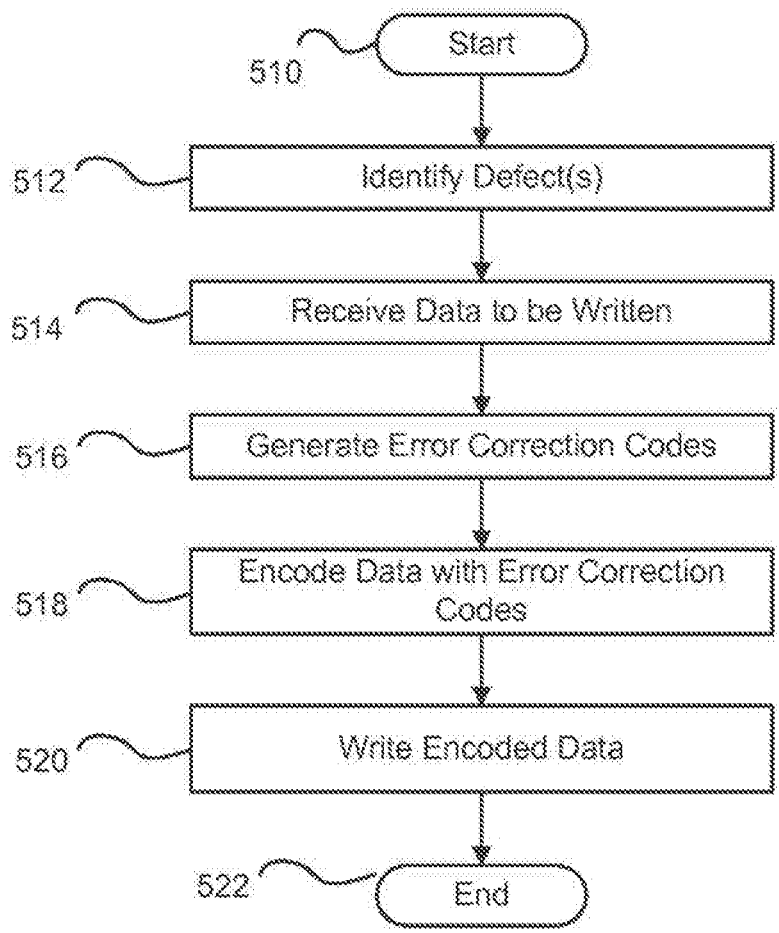
FIG. 5 depicts a flowchart illustrating a method for encoding data in accordance with an embodiment of the present disclosure.

FIG. 5 shows a method 500 for encoding data in accordance with an embodiment of the present disclosure. In some embodiments, the method 500 may be performed at a hardware level such as controller 320. At block 510, the method 500 may begin.

At block 512, data may be read from memory and analyzed to determine whether there are any errors in the data and also whether there are any corresponding defects in memory cells storing the data. In some embodiments, the defect detection module 410 may analyze the read data to identify defective memory cells. Defective memory cells may include cells that return the same output regardless of input. In this instance, the defective memory cells may be unable to retain an injected charge. An example of a defective memory cell is described below with respect to FIGS. 6A and 6B.

In some embodiments, defective memory cells may be identified by storing a copy of data previously written to the memory and comparing data read back from memory. For example, the previously written message may be a test pattern or predetermined message such that when read back from memory, differences between the test pattern and the read data may be detected. The read message may also be subjected to error correcting for random errors. Any remaining errors may be attributed to defective memory cells. The locations of the defective memory cells may also be determined. In some embodiments, the steps of determining the defective memory cells may be performed once such that step 512 does not have to be repeated each time new data is to be written to memory. After the defects have been identified at block 512, the overall process may proceed to block 514.

At block 514, data to be written may be received. In some embodiments, the encoding module 400 may receive the data to be written. The data may be user data generated by the host system 310 and received at the memory controller 320. In some instances, the data to be written may be a message m of various bit lengths k. After the data to be written has been received at block 514, the overall process may proceed to block 516.

At block 516, error correction codes may be generated for the data to be written to memory. In some embodiments, the encoding module 400 may generate the error correction codes. A first error correction code may be generated to correct for random errors. The random errors may be due to noise or interference within the memory. The first error correction code "p" may contain r bits and be generated from one of a plurality of preset error correction algorithms. For example, the first error correction code "p" may be generated by calculating a combination of a predetermined matrix and the data to be written from block 514.

In addition, at block 516, the data received at block 514 may be divided into sub-messages in conjunction with the generation of second error correction codes. In some embodiments, the encoding module 400 may divide the data into sub-messages and generate the second error correction codes. The data received at block 514 may correspond to user data or a message "m" that is to be written to memory. In some embodiments, this message "m" of k bits may be subdivided into sub-messages $m_1, \ldots, m_l$. In at least one example, each sub-message (e.g., $m_i$) may correspond in size to k/l, where l is equal to the number of bits necessary for the second error correction codes used to mask defects. An error correction code for masking defects "$d_i$" may be generated for each sub-message (e.g., $m_i$). The error correction code for each sub-message may be a single bit and mask defects specific to that sub-message in some instances.

In some embodiments, the error correction code for masking defects "$d_i$" may be set to either a value of "1" or "0" based on the defective memory cells to store the sub-message "$m_i$." In particular, the data of the sub-message $m_i$ a set of 1's and/or 0's, may be compared to any defective memory cells stuck-at certain values (e.g., 1 or 0). As part of this comparison, it may be determined whether more than half of the stuck-at cells correspond to the bits of the sub-message $m_i$. If more than half of the stuck bits correspond to the bits of the sub-message $m_i$ the code $d_i$ may be set to 0, such that the bits are not flipped. However, if less than half of the stuck bits correspond to the bits of the sub-message $m_i$, the code $d_i$ may be set to 1, such that the bits are flipped. However, if less than half of the stuck-at cells do not correspond to the sub-message $m_i$ data, the code $d_i$ may be set to 1 such that the bits are flipped. As a result, more than half of the stuck-at values may be protected against by the single bit of the code $d_i$. After the data has been analyzed at block 516, the overall process may proceed to block 518.

At block 518, new data to be written to memory may be encoded. In some embodiments, the data may be encoded by the encoder module 420. The data to be written may be encoded using the error correction codes generated at block 516. In particular, the data to be written may be formed into a new message comprising each sub-message $m_i$, corresponding second error correction code $d_i$, and first error correction code p. An example of the combined message to be written is described below with respect to FIG. 8. After the new data has been encoded at block 518, the overall process may proceed to block 520.

At block 520, the encoded data may be written to memory. In some embodiments, the data may be written to memory (e.g., flash memory) by the control module 430. After data has been written at block 520, the overall process may proceed to block 522.

At block 522, the process may end. In some embodiments, the process may proceed back to step 510 and may be repeated periodically or continuously.

Figure 6A:
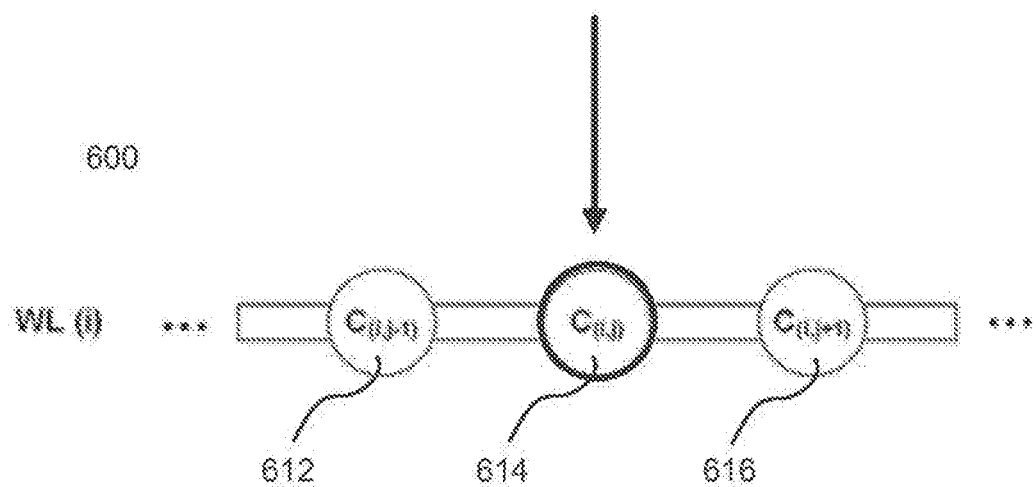
FIGS. 6A and 6B depict memory cells in accordance with an embodiment of the present disclosure.
Figure 6B:
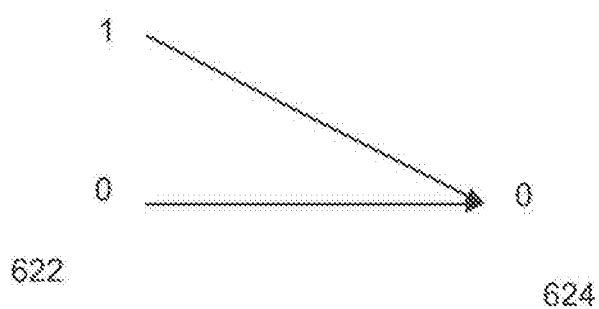

FIGS. 6A and 6B show memory cells in accordance with an embodiment of the present disclosure. In particular, FIG. 6A shows a first word line i comprising memory cells $C_{(i,j-1)}$ 612, $C_{(i,j)}$ 614, and $C_{(i,j+1)}$ 616. The first word line i may correspond to a word line of non-volatile memory storage system 332 in one instance. In at least one example, it may be determined that memory cell $C_{(i,j)}$ 614 is defective as described above with respect to block 512. Memory cell $C_{(i,j)}$ 614 may be a defective binary memory cell and stuck-at a particular value regardless of the channel input. FIG. 6B shows an example of memory cell $C_{(i,j)}$ 614 outputting a "0" 624 regardless of whether an input is "0" or "1" 622.

Figure 7A:
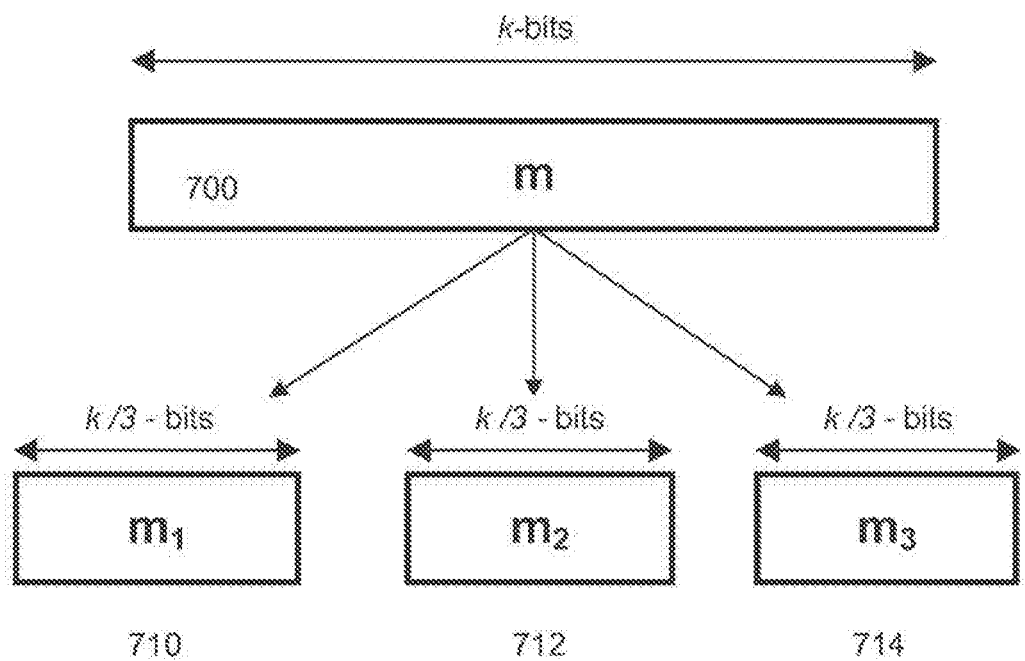
FIGS. 7A, 7B, and 7C depict an example of message components in accordance with an embodiment of the present disclosure.
Figure 7B:
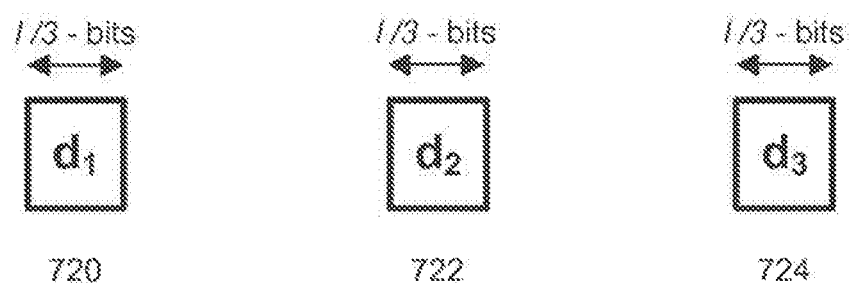
Figure 7C:
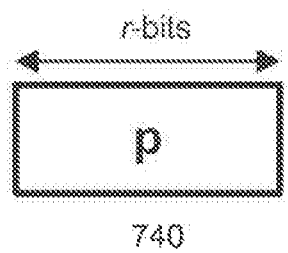

FIGS. 7A, 7B, and 7C show an example of message components in accordance with an embodiment of the present disclosure. The message components shown in FIGS. 7A, 7B, and 7C may comprise a combined error corrected message to be written to memory. FIG. 7A shows an original message 700 of user data to be written to memory. In some instances, the original message 700 may be data received from host system 310 to be written to non-volatile memory storage system 332. The original message 700 may be comprised of k bits. In preparation for writing the original message 700 to memory, the original message 700 may be sub-divided into sub-messages. The message 700 may be subdivided into sub-messages such defective memory cells may be masked for each individual sub-message. In this example, the original message 700 may be sub-divided into three sub-messages: $m_1$ 710, $m_2$ 712, and $m_3$ 714. The number of sub-messages may be determined based on the number of bits 1 necessary to provide sufficient masking of stuck-at defects. In this example, 1 may equal three bits such that the original message 700 is divided into the three sub-messages: $m_1$ 710, $m_2$ 712, and $m_3$ 714.

In addition to sub-dividing the original message 700, error correction codes $d_i$ may be generated. This is shown, for example, in FIG. 7B. In this instance, three single bit error correction codes may be generated: $d_1$ 720, $d_2$ 722, and $d_3$ 724. Each of the single bit error correction codes may be for masking stuck-at defects particular to the corresponding sub-message (e.g., $d_1$ 720 masking stuck-at defects in $m_1$ 710). Further, an error correction code p 740 to correct for random errors for all of the sub-messages may be generated. The error correction code p 740 may comprise r bits as shown in FIG. 7C.

Figure 8:
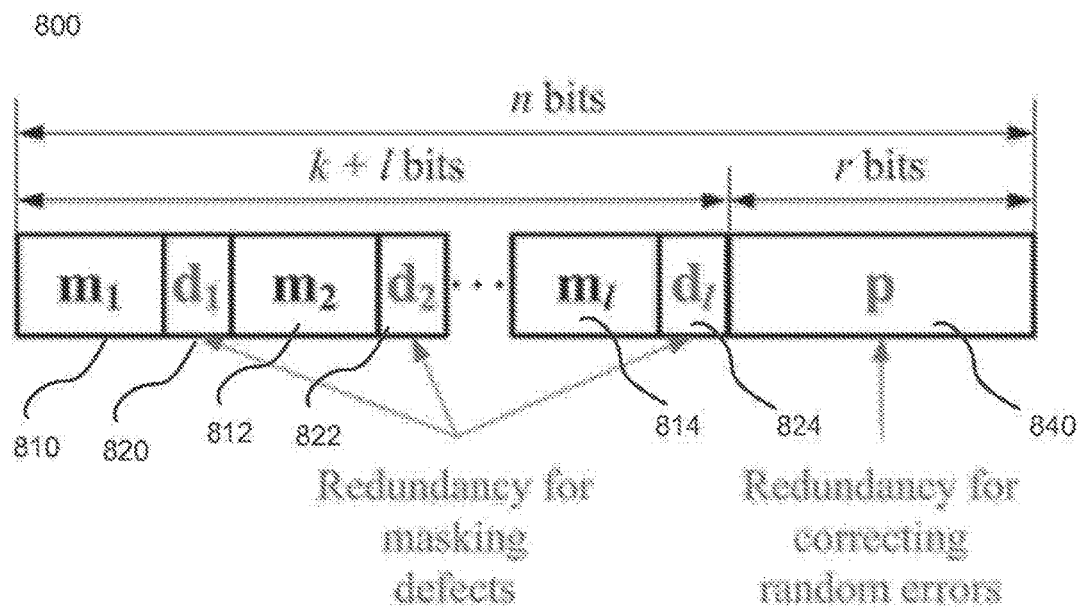
FIG. 8 depicts an example of an encoded message in accordance with an embodiment of the present disclosure.

FIG. 8 shows an example of an encoded message in accordance with an embodiment of the present disclosure. The encoded message 800 shown in FIG. 8 may correspond to the message generated at block 518 as described above. In this example, encoded message 800 may comprise multiple sub-messages ($m_1$ 810, $m_2$ 812, and $m_l$ 814), corresponding error correction codes for masking defects ($d_1$ 820, $d_2$ 822, and $d_l$ 824), and an error correction code for random errors (p 840). The total size of the encoded message 800 may be n bits including r bits for the error correction code for random errors (p 840) and k+l bits for the multiple sub-messages ($m_1$ 810, $m_2$ 812, and $m_j$ 814) and corresponding error correction codes for masking defects ($d_1$ 820, $d_2$ 822, and $d_j$824).

Other embodiments are within the scope and spirit of the invention. For example, the functionality described above can be implemented using software, hardware, firmware, hardwiring, or combinations of any of these. One or more computer processors operating in accordance with instructions may implement the functions associated with error correction for NVM storage systems in accordance with the present disclosure as described above. If such is the case, it is within the scope of the present disclosure that such instructions may be stored on one or more non-transitory processor readable storage media (e.g., a magnetic disk or other storage medium). Additionally, modules implementing functions may also be physically located at various positions, including being distributed such that portions of functions are implemented at different physical locations.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method, implemented by a controller, of error correcting data for writing to a memory, the method comprising:
   determining whether the memory includes a defective memory cell;
   receiving a message to be written to the memory;
   sub-dividing the message into a plurality of sub-messages;
   generating a first error correction code for the sub-messages, the first error correction code being a first type;
   generating a plurality of second error correction codes for the sub-messages, the second error correction codes being a second type different from the first type;
   generating a combined message comprising the sub-messages, the first error correction code, and the plurality of second error correction codes; and
   writing the combined message to the memory, at least a portion of the combined message being written to the defective memory cell.

2. The method of claim 1, wherein the memory is a non-volatile memory storage system.

3. The method of claim 2, wherein the non-volatile memory storage system is a solid state drive.

4. The method of claim 1, wherein an output of the defective memory cell is the same for different inputs to the defective memory cell.

5. The method of claim 1, wherein each of the sub-divided messages is of an equal amount of data.

6. The method of claim 5, wherein the sub-dividing of the message is based on the plurality of second error correction codes.

7. The method of claim 1, wherein the first error correction code is an error correction code for random errors.

8. The method of claim 7, wherein the random errors are due to noise in the memory.

9. The method of claim 1, wherein each of the plurality of second error correction codes corresponds to a single sub-message.

10. The method of claim 9, wherein one of the plurality of second error correction codes is an error correction code for masking the defective memory cell.

11. The method of claim 9, wherein each of the plurality of second error correction codes are a single bit.

12. The method of claim 11, wherein a value of one of the plurality of second error correction codes is based on a value of the defective memory cell.

13. The method of claim 12, further comprising:
    determining whether the value of the defective memory cell matches a value of the sub-message.

14. The method of claim 13, further comprising:
    determining whether the value of the of the defective memory cell matches an opposite of the value of the sub-message.

15. The method of claim 14, wherein the value of the one of the plurality of second error correction codes is set to one or zero based on the determination of whether the value of the defective memory cell matches the value of the sub-message, and whether the value of the of the defective memory cell matches the opposite of the value of the sub-message.

16. The method of claim 1, wherein determining whether the memory includes the defective memory cell comprises reading previously written data from the memory.

17. The method of claim 16, wherein the determining further comprises comparing the read data to a predetermined data pattern.

18. The method of claim 1, further comprising:
    generating a second combined message for a second message to be written to the memory based on the determination of whether the memory includes the defective memory cell; and
    writing the second combined message to the memory.

19. A computer program product comprised of a series of instructions executable on a computer, the computer program product performing a process for encoding data for writing to a memory; the computer program implementing the steps of:
    determining whether the memory includes a defective memory cell;
    receiving a message to be written to the memory;
    sub-dividing the message into a plurality of sub-messages;
    generating a first error correction code for the sub-messages, the first error correction code being a first type;
    generating a plurality of second error correction codes for the sub-messages, the second error correction codes being a second type different from the first type;
    generating a combined message comprising the sub-messages, the first error correction code, and the plurality of second error correction codes; and
    writing the combined message to the memory, at least a portion of the combined message being written to the defective memory cell.

20. A system for encoding data for writing to a memory, the system comprising:

a determining module that determines whether the memory includes a defective memory cell;

a receiving module that receives a message to be written to the memory;

a sub-dividing module that sub-divides the message into a plurality of sub-messages;

a first error correction code generating module that generates a first error correction code for the sub-messages, the first error correction code being a first type;

a second error correction code generating module that generates a plurality of second error correction codes for the sub-messages, the second error correction codes being a second type different from the first type;

a combined message generating module that generates a combined message comprising the sub-messages, the first error correction code, and the plurality of second error correction codes; and a writing module that writes the combined message to the memory, at least a portion of the combined message being written to the defective memory cell.

* * * * *